United States Patent [19]
Park et al.

[11] Patent Number: 5,537,430
[45] Date of Patent: Jul. 16, 1996

[54] TRELLIS-CODED MODULATION SYSTEM

[75] Inventors: Hyun-woo Park; Jun-Tin Gong; Tak-hun Lee, all of Kyungki-do, Rep. of Korea

[73] Assignee: Samsung Electronics Co., Ltd., Suwon, Rep. of Korea

[21] Appl. No.: 165,841

[22] Filed: Dec. 14, 1993

[30] Foreign Application Priority Data

Dec. 31, 1992 [KR] Rep. of Korea ............ 92-27528

[51] Int. Cl.$^6$ .................. H03M 13/12; H04L 1/00
[52] U.S. Cl. ............................. 371/43; 375/265
[58] Field of Search .................. 371/43, 46; 375/265

[56] References Cited

U.S. PATENT DOCUMENTS

| | | | |
|---|---|---|---|
| 4,520,490 | 5/1985 | Wei | 375/246 |
| 4,581,601 | 4/1986 | Calderbank et al. | 341/95 |
| 4,601,044 | 7/1986 | Kromer, III et al. | 375/286 |
| 4,807,230 | 2/1989 | Sriniyasagopalan | 371/46 |
| 4,807,253 | 2/1989 | Hagenauer | 375/284 |
| 4,873,701 | 10/1989 | Tretter | 375/245 |
| 4,939,555 | 7/1990 | Calderbank et al. | 375/286 |
| 4,980,897 | 12/1990 | Decker et al. | 375/265 |
| 5,231,639 | 7/1993 | Matui | 371/43 |

FOREIGN PATENT DOCUMENTS 0348305  12/1989  European Pat. Off. .

OTHER PUBLICATIONS

Lin et al., *Error Control Coding Fundamentals and Applications*, Prentice–Hall, Inc., 1983, pp. 287–314.

Ungerboeck, Gottfried, "Trellis–Coded Modulation with Redundant Signal Sets Part 1: Introduction", IEEE Communications Magazine, 25:2, Feb. 1987, pp. 5–21.

*Primary Examiner*—Stephen M. Baker
*Attorney, Agent, or Firm*—Rothwell, Figg, Ernst & Kurz

[57] ABSTRACT

A convolutional encoder for a trellis coded modulation (TCM) system includes a first adder first outputting a first output bit by a modulo-two sum of a present input bit and a twice-delayed input bit of an upper stage, a present input bit and a once-delayed input bit of a lower stage, among 3-bit output bits; a second adder for outputting a second output bit by a modulo-two sum of a once-delayed input bit and a twice-delayed input bit of the upper stage and a present input bit of the lower stage; and a third adder for outputting a third output bit by a modulo-two sum of a present input bit of the upper stage and a once-delayed input bit of the lower stage. A trellis-coded modulation system includes a coder for receiving and encoding data; a mapper for inputting the remaining uncoded bit and the bit coded by the coder and converting them into a predetermined bit; a modulator for modulating the bit signal output from the mapper; and a controller for controlling the coder and mapper. Therefore, circuitry is simplified and the integration thereof is easy, while speed is improved.

7 Claims, 16 Drawing Sheets

FIG. 5

| PRESENT STATE (M1,M2,M3) \ INPUT | 00 | 01 | 10 | 11 |
|---|---|---|---|---|
| | NEXT STATE(M1,M2,M3)/OUTPUT | | | |
| 000 | 000/000 | 001/110 | 100/101 | 101/011 |
| 001 | 000/101 | 001/011 | 100/000 | 101/110 |
| 010 | 000/110 | 001/000 | 100/011 | 101/101 |
| 011 | 000/011 | 001/000 | 100/110 | 101/000 |
| 100 | 000/010 | 011/100 | 110/111 | 111/001 |
| 101 | 000/111 | 011/001 | 110/010 | 111/100 |
| 110 | 000/100 | 011/010 | 110/001 | 111/111 |
| 111 | 000/001 | 011/111 | 110/100 | 111/010 |

FIG. 7

| PRESENT STATE (M1,M2,M3) \ INPUT | 00 | 01 | 10 | 11 |
|---|---|---|---|---|
| | \multicolumn{4}{c}{NEXT STATE(M1,M2,M3)/OUTPUT} |
| 000 | 000/000 | 010/110 | 100/101 | 110/011 |
| 001 | 000/101 | 010/011 | 100/000 | 110/110 |
| 010 | 001/110 | 011/111 | 101/100 | 111/010 |
| 011 | 001/100 | 011/010 | 101/001 | 111/111 |
| 100 | 000/011 | 010/101 | 100/110 | 110/000 |
| 101 | 000/110 | 010/000 | 100/011 | 110/101 |
| 110 | 001/010 | 011/100 | 101/111 | 111/001 |
| 111 | 001/111 | 011/001 | 101/010 | 111/100 |

FIG. 10

| 204 Signal | SIGNAL POINT NUMBER | INPUT DATA | | | | | OUTPUT DATA | | | | | | | |
|---|---|---|---|---|---|---|---|---|---|---|---|---|---|---|
| | | D4 | D3 | D2 | D1 | D0 | I3 | I2 | I1 | I0 | Q3 | Q2 | Q1 | Q0 |
| '0' | 0  | 0 | 0 | 0 | 0 | 0 | 0 | 0 | 0 | 0 | 0 | 1 | 0 | 1 |
| | 1  | 0 | 0 | 0 | 0 | 1 | 0 | 1 | 0 | 0 | 0 | 0 | 0 | 1 |
| | 2  | 0 | 0 | 0 | 1 | 0 | 0 | 1 | 0 | 1 | 0 | 1 | 0 | 1 |
| | 3  | 0 | 0 | 0 | 1 | 1 | 1 | 0 | 0 | 1 | 0 | 1 | 0 | 1 |
| | 4  | 0 | 0 | 1 | 0 | 0 | 0 | 0 | 0 | 0 | 0 | 0 | 1 | 0 |
| | 5  | 0 | 0 | 1 | 0 | 1 | 0 | 1 | 0 | 0 | 0 | 0 | 1 | 0 |
| | 6  | 0 | 0 | 1 | 1 | 0 | 0 | 0 | 0 | 1 | 0 | 1 | 1 | 0 |
| | 7  | 0 | 0 | 1 | 1 | 1 | 0 | 1 | 0 | 1 | 0 | 1 | 1 | 0 |
| | 8  | 0 | 1 | 0 | 0 | 0 | 0 | 1 | 1 | 0 | 0 | 1 | 1 | 0 |
| | 9  | 0 | 1 | 0 | 0 | 1 | 0 | 0 | 1 | 0 | 0 | 1 | 1 | 0 |
| | 10 | 0 | 1 | 0 | 1 | 0 | 0 | 1 | 1 | 1 | 0 | 0 | 1 | 0 |
| | 11 | 0 | 1 | 0 | 1 | 1 | 0 | 0 | 1 | 1 | 0 | 0 | 1 | 0 |
| | 12 | 0 | 1 | 1 | 0 | 0 | 1 | 0 | 0 | 0 | 0 | 0 | 1 | 1 |
| | 13 | 0 | 1 | 1 | 0 | 1 | 0 | 1 | 0 | 0 | 0 | 1 | 1 | 1 |
| | 14 | 0 | 1 | 1 | 1 | 0 | 0 | 1 | 0 | 1 | 0 | 0 | 1 | 1 |
| | 15 | 0 | 1 | 1 | 1 | 1 | 0 | 0 | 0 | 1 | 0 | 0 | 1 | 1 |
| | 16 | 1 | 0 | 0 | 0 | 0 | 0 | 1 | 0 | 0 | 1 | 0 | 0 | 0 |
| | 17 | 1 | 0 | 0 | 0 | 1 | 0 | 0 | 0 | 0 | 0 | 1 | 0 | 0 |
| | 18 | 1 | 0 | 0 | 1 | 0 | 0 | 1 | 0 | 1 | 0 | 1 | 0 | 0 |
| | 19 | 1 | 0 | 0 | 1 | 1 | 0 | 1 | 0 | 1 | 0 | 0 | 0 | 0 |
| | 20 | 1 | 0 | 1 | 0 | 0 | 0 | 0 | 1 | 0 | 0 | 1 | 1 | 1 |
| | 21 | 1 | 0 | 1 | 0 | 1 | 0 | 0 | 1 | 0 | 0 | 0 | 1 | 1 |
| | 22 | 1 | 0 | 1 | 1 | 0 | 0 | 1 | 1 | 1 | 0 | 1 | 1 | 1 |
| | 23 | 1 | 0 | 1 | 1 | 1 | 0 | 1 | 1 | 1 | 0 | 0 | 1 | 1 |
| | 24 | 1 | 1 | 0 | 0 | 0 | 0 | 1 | 1 | 0 | 0 | 0 | 0 | 1 |
| | 25 | 1 | 1 | 0 | 0 | 1 | 0 | 1 | 1 | 0 | 0 | 1 | 0 | 0 |
| | 26 | 1 | 1 | 0 | 1 | 0 | 0 | 0 | 1 | 1 | 0 | 0 | 0 | 1 |
| | 27 | 1 | 1 | 0 | 1 | 1 | 0 | 0 | 1 | 1 | 0 | 1 | 0 | 1 |
| | 28 | 1 | 1 | 1 | 0 | 0 | 0 | 0 | 1 | 0 | 0 | 0 | 0 | 0 |
| | 29 | 1 | 1 | 1 | 0 | 1 | 0 | 1 | 1 | 0 | 0 | 1 | 0 | 0 |
| | 30 | 1 | 1 | 1 | 1 | 0 | 0 | 0 | 1 | 1 | 0 | 1 | 0 | 0 |
| | 31 | 1 | 1 | 1 | 1 | 1 | 0 | 0 | 1 | 1 | 1 | 0 | 0 | 0 |
| '1' | -  | - | - | - | - | - | 0 | 0 | 0 | 0 | 0 | 0 | 0 | 0 |

FIG. 13

| 204 Signal | SIGNAL POINT NUMBER | INPUT DATA | | | | | OUTPUT DATA | | | | | |
|---|---|---|---|---|---|---|---|---|---|---|---|---|
| | | D4 | D3 | D2 | D1 | D0 | I2 | I1 | I0 | Q2 | Q1 | Q0 |
| '0' | 0 | 0 | 0 | 0 | 0 | 0 | 0 | 0 | 1 | 1 | 1 | 0 |
| | 1 | 0 | 0 | 0 | 0 | 1 | 0 | 0 | 1 | 0 | 0 | 1 |
| | 2 | 0 | 0 | 0 | 1 | 0 | 1 | 1 | 0 | 0 | 0 | 1 |
| | 3 | 0 | 0 | 0 | 1 | 1 | 1 | 0 | 0 | 1 | 0 | 0 |
| | 4 | 0 | 0 | 1 | 0 | 0 | 1 | 1 | 0 | 1 | 0 | 1 |
| | 5 | 0 | 0 | 1 | 0 | 1 | 0 | 0 | 1 | 1 | 0 | 1 |
| | 6 | 0 | 0 | 1 | 1 | 0 | 1 | 0 | 0 | 0 | 1 | 0 |
| | 7 | 0 | 0 | 1 | 1 | 1 | 0 | 0 | 1 | 0 | 0 | 0 |
| | 8 | 0 | 1 | 0 | 0 | 0 | 0 | 0 | 1 | 0 | 1 | 0 |
| | 9 | 0 | 1 | 0 | 0 | 1 | 1 | 0 | 0 | 0 | 0 | 0 |
| | 10 | 0 | 1 | 0 | 1 | 0 | 1 | 0 | 0 | 1 | 0 | 1 |
| | 11 | 0 | 1 | 0 | 1 | 1 | 1 | 1 | 0 | 0 | 1 | 0 |
| | 12 | 0 | 1 | 1 | 0 | 0 | 0 | 0 | 0 | 1 | 0 | 1 |
| | 13 | 0 | 1 | 1 | 0 | 1 | 1 | 0 | 1 | 1 | 0 | 1 |
| | 14 | 0 | 1 | 1 | 1 | 0 | 0 | 1 | 0 | 0 | 1 | 0 |
| | 15 | 0 | 1 | 1 | 1 | 1 | 1 | 0 | 1 | 0 | 0 | 0 |
| | 16 | 1 | 0 | 0 | 0 | 0 | 0 | 0 | 0 | 1 | 0 | 0 |
| | 17 | 1 | 0 | 0 | 0 | 1 | 0 | 1 | 0 | 0 | 0 | 1 |
| | 18 | 1 | 0 | 0 | 1 | 0 | 0 | 1 | 0 | 1 | 1 | 0 |
| | 19 | 1 | 0 | 0 | 1 | 1 | 1 | 0 | 1 | 1 | 0 | 0 |
| | 20 | 1 | 0 | 1 | 0 | 0 | 0 | 0 | 1 | 1 | 0 | 0 |
| | 21 | 1 | 0 | 1 | 0 | 1 | 1 | 0 | 0 | 0 | 0 | 1 |
| | 22 | 1 | 0 | 1 | 1 | 0 | 1 | 0 | 0 | 1 | 1 | 0 |
| | 23 | 1 | 0 | 1 | 1 | 1 | 1 | 1 | 0 | 1 | 0 | 0 |
| | 24 | 1 | 1 | 0 | 0 | 0 | 0 | 0 | 0 | 0 | 1 | 0 |
| | 25 | 1 | 1 | 0 | 0 | 1 | 0 | 1 | 0 | 0 | 0 | 0 |
| | 26 | 1 | 1 | 0 | 1 | 0 | 0 | 1 | 0 | 1 | 0 | 1 |
| | 27 | 1 | 1 | 0 | 1 | 1 | 1 | 0 | 1 | 0 | 1 | 0 |
| | 28 | 1 | 1 | 1 | 0 | 0 | 0 | 0 | 0 | 0 | 0 | 1 |
| | 29 | 1 | 1 | 1 | 0 | 1 | 1 | 0 | 1 | 0 | 0 | 1 |
| | 30 | 1 | 1 | 1 | 1 | 0 | 1 | 0 | 1 | 1 | 1 | 0 |
| | 31 | 1 | 1 | 1 | 1 | 1 | 0 | 1 | 0 | 1 | 0 | 0 |
| '1' | – | – | | | | | 0 | 0 | 0 | 0 | 0 | 0 |

FIG. 16

| 204 Signal | SIGNAL POINT NUMBER | INPUT DATA D4 D3 D2 D1 D0 | OUTPUT DATA I3 I2 I1 I0 | Q3 Q2 Q1 Q0 |
|---|---|---|---|---|
| '0' | 0  | 0 0 0 0 0 | 0 0 0 0 | 0 0 1 1 |
|     | 1  | 0 0 0 0 1 | 0 0 0 0 | 1 0 0 0 |
|     | 2  | 0 0 0 1 0 | 0 1 0 1 | 0 0 1 1 |
|     | 3  | 0 0 0 1 1 | 0 1 0 1 | 1 0 0 0 |
|     | 4  | 0 0 1 0 0 | 0 0 1 1 | 0 0 1 0 |
|     | 5  | 0 0 1 0 1 | 0 0 1 1 | 0 1 1 1 |
|     | 6  | 0 0 1 1 0 | 1 0 0 0 | 0 0 1 0 |
|     | 7  | 0 0 1 1 1 | 1 0 0 0 | 0 1 1 1 |
|     | 8  | 0 1 0 0 0 | 0 0 1 1 | 0 0 0 0 |
|     | 9  | 0 1 0 0 1 | 0 0 1 0 | 0 1 0 1 |
|     | 10 | 0 1 0 1 0 | 1 0 0 0 | 0 0 0 0 |
|     | 11 | 0 1 0 1 1 | 1 0 0 0 | 0 1 0 1 |
|     | 12 | 0 1 1 0 0 | 0 0 0 0 | 0 0 0 1 |
|     | 13 | 0 1 1 0 1 | 0 0 0 0 | 0 1 1 0 |
|     | 14 | 0 1 1 1 0 | 0 1 0 1 | 0 0 0 1 |
|     | 15 | 0 1 1 1 1 | 0 1 0 1 | 0 1 1 0 |
|     | 16 | 1 0 0 0 0 | 0 0 0 1 | 0 0 1 0 |
|     | 17 | 1 0 0 0 1 | 0 0 0 1 | 0 1 1 1 |
|     | 18 | 1 0 0 1 0 | 0 1 1 0 | 0 0 1 0 |
|     | 19 | 1 0 0 1 1 | 0 1 1 0 | 0 1 1 1 |
|     | 20 | 1 0 1 0 0 | 0 0 1 0 | 0 0 0 1 |
|     | 21 | 1 0 1 0 1 | 0 0 1 0 | 0 1 1 0 |
|     | 22 | 1 0 1 1 0 | 0 1 1 1 | 0 0 0 1 |
|     | 23 | 1 0 1 1 1 | 0 1 1 1 | 0 1 1 0 |
|     | 24 | 1 1 0 0 0 | 0 0 1 0 | 0 0 1 1 |
|     | 25 | 1 1 0 0 1 | 0 0 1 0 | 1 0 0 0 |
|     | 26 | 1 1 0 1 0 | 0 1 1 1 | 0 0 1 1 |
|     | 27 | 1 1 0 1 1 | 0 1 1 1 | 1 0 0 0 |
|     | 28 | 1 1 1 0 0 | 0 0 0 1 | 0 0 0 0 |
|     | 29 | 1 1 1 0 1 | 0 0 0 1 | 0 1 0 1 |
|     | 30 | 1 1 1 1 0 | 0 1 1 0 | 0 0 0 0 |
|     | 31 | 1 1 1 1 1 | 0 1 1 0 | 0 1 0 1 |
| '1' |    |           | 0 0 0 0 | 0 0 0 0 |

TRELLIS-CODED MODULATION SYSTEM

BACKGROUND OF THE INVENTION

The present invention relates to a trellis-coded modulation (TCM) system, and more particularly, to an apparatus which generates a coded signal which can correct errors produced during a magnetic recording and reproducing of a signal and converts the coded signal into digital data having the corresponding amplitude and phase.

An early TCM system is described in "Trellis-coded Modulation with Redundant Signal Sets, Part 1: Introduction" by Gottfried Ungerboeck (*IEEE Communications Magazine*. February 1987. pp 5–21).

FIG. 1 is a block diagram of the encoder for a non-linear eight-state TCM code having a 32-CROSS signal set. The encoder is constituted by a data source 110, a convolutional encoder 120, a subset selector 130, a signal point selector 140, and a modulator 150.

In FIG. 1, the convolutional encoder 120 outputs 3-bit data 103 by adding a redundant bit to 2-bit data 102 among the data transmitted from the data source 110. The output 3-bit data 103 selects a subset in the 32-CROSS signal constellation shown in FIG. 2, among eight subsets which are set-partitioned by the Ungerboeck method, and outputs the selected subset to the signal point selector 140. At this time, the subset includes four signal points. The signal point to be transmitted by an uncoded 2-bit 101 signal is selected by selector 140 in the subset and is transmitted to the modulator 150. The outputs of the signal point selector 140 are rearranged by designating an amplitude and phase to each symbol by the set partition. The values of the rearranged signal points are converted to level values by the modulator 150 and transmitted to channels on a carrier. In the coding method using TCM modulation, if the bandwidth is restricted because input data is encoded to maximize the euclidean distance between symbols on a signal space, a higher coding gain than that of a prior art error correction system can be obtained without increasing bandwidth.

However, since the processes of selecting a subset in the signal constellation and selecting a signal point in the subset are separated from each other, the embodiment and integration of such a circuit is open to improvement.

SUMMARY OF THE INVENTION

It is an object of the present invention to provide a convolutional encoder having a new generation polynomial.

Another object of the present invention is to provide a trellis-coded modulation system using the convolutional encoder.

Still another object of the present invention is to provide a trellis-coded modulation system which simplifies the circuit embodiment and integration. To accomplish the object, the convolutional encoder according to the present invention comprises:

first adding means for outputting a first output bit among 3-bit output bits by a modulo-two sum of a present input bit of an upper stage and a twice-delayed input bit of the tipper stage, a present input bit of a lower stage and a once-delayed input bit of the lower stage:

second adding means for outputting a second output bit by a modulo-two sum of a once-delayed input bit and a twice-delayed input bit of the upper stage and a present input bit of the lower stage: and third adding means for outputting a third output bit by a modulo-two sum of a present input bit of the upper stage and a once-delayed input bit of the lower stage.

Also, the convolutional encoder according to the present invention comprises:

first adding means for outputting a first output bit among 3-bit output bits by a modulo-two sum of a present input bit of an tipper stage and a twice-delayed input bit of a lower stage and a present input bit of a lower stage:

second adding means for outputting a second output bit by a modulo-two sum of a once-delayed input bit of the upper stage and a present input bit the lower stage: and third adding means for outputting a third output bit by a modulo-two sum of a present input bit and a once-delayed input bit of the upper stage, a once-delayed input bit of the lower input and a twice-delayed input bit of the lower range.

To accomplish the other objects, the trellis-coded modulation system according to the present invention comprises:

coding means for inputting data and coding the input data;

mapping means for inputting the remaining uncoded bit and the bit coded by the coding means and converting them into a predetermined bit;

modulating means for modulating the bit signal output from the mapping means; and controlling means for controlling the coding means and the mapping means.

BRIEF DESCRIPTION OF THE DRAWINGS

FIG. 5 is a state table according to the convolutional encoder shown in FIG. 4;

FIG. 7 is a state table according to the convolutional encoder shown in FIG. 6;

FIG. 10 is an output table of the signal point bits according to the pre-mapper shown in FIG. 9;

FIG. 13 is a table showing the output of the signal point according to the signal constellation shown in FIG. 12:

FIG. 16 is a table showing the output of the signal point according to the signal constellation shown in FIG. 15.

DETAILED DESCRIPTION OF THE INVENTION

The convolutional encoder and the trellis-coded modulation (TCM) system according to the present invention will be described with reference to the accompanying the drawings.

Figure 3:
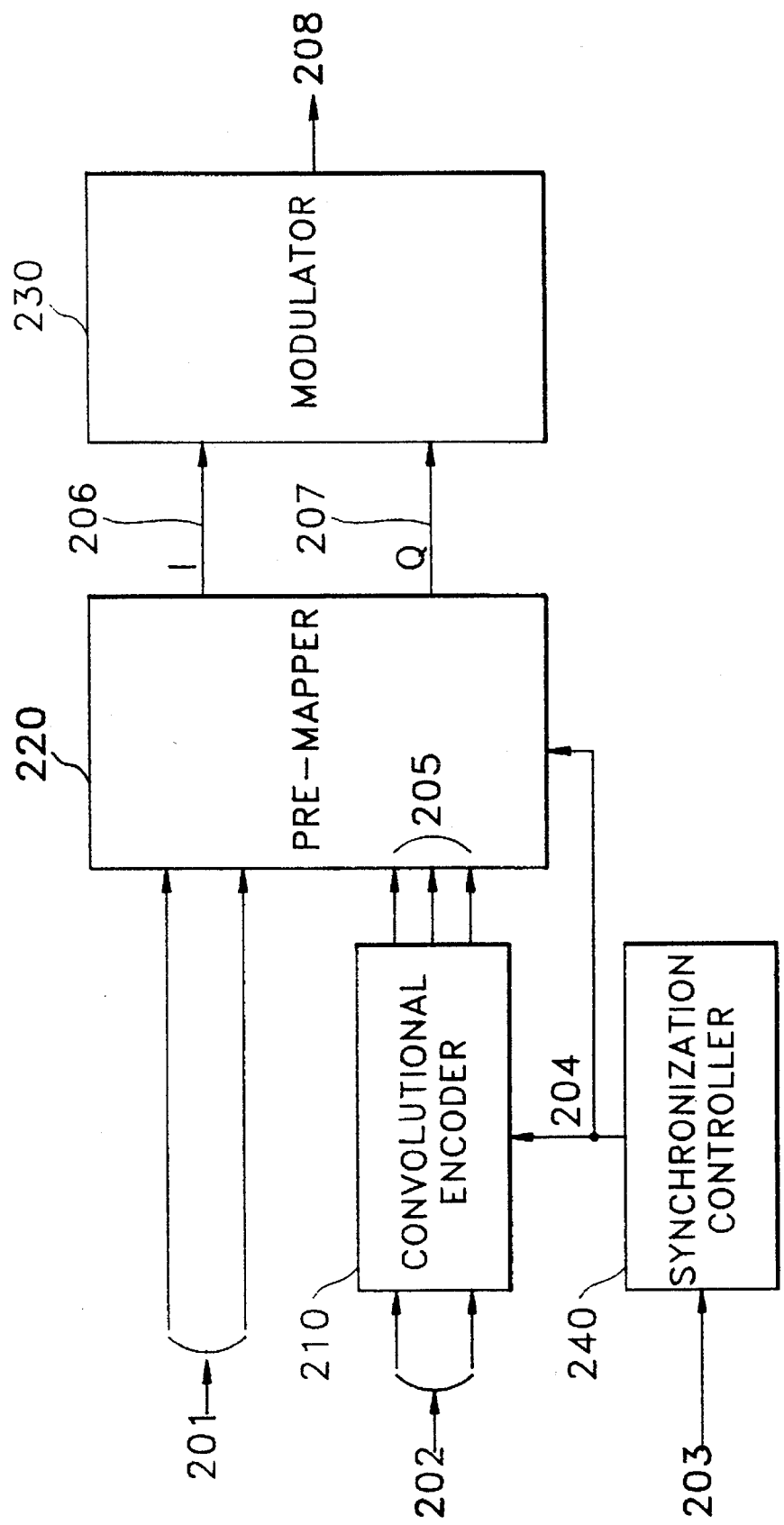
FIG. 3 is a block diagram of a trellis-coded modulation system according to the present invention.

FIG. 3 which is a block diagram of a TCM system according to the present invention, shows a convolutional encoder 210, a synchronization controller 240, a pre-mapper 220 and a modulator 230.

Figure 1:
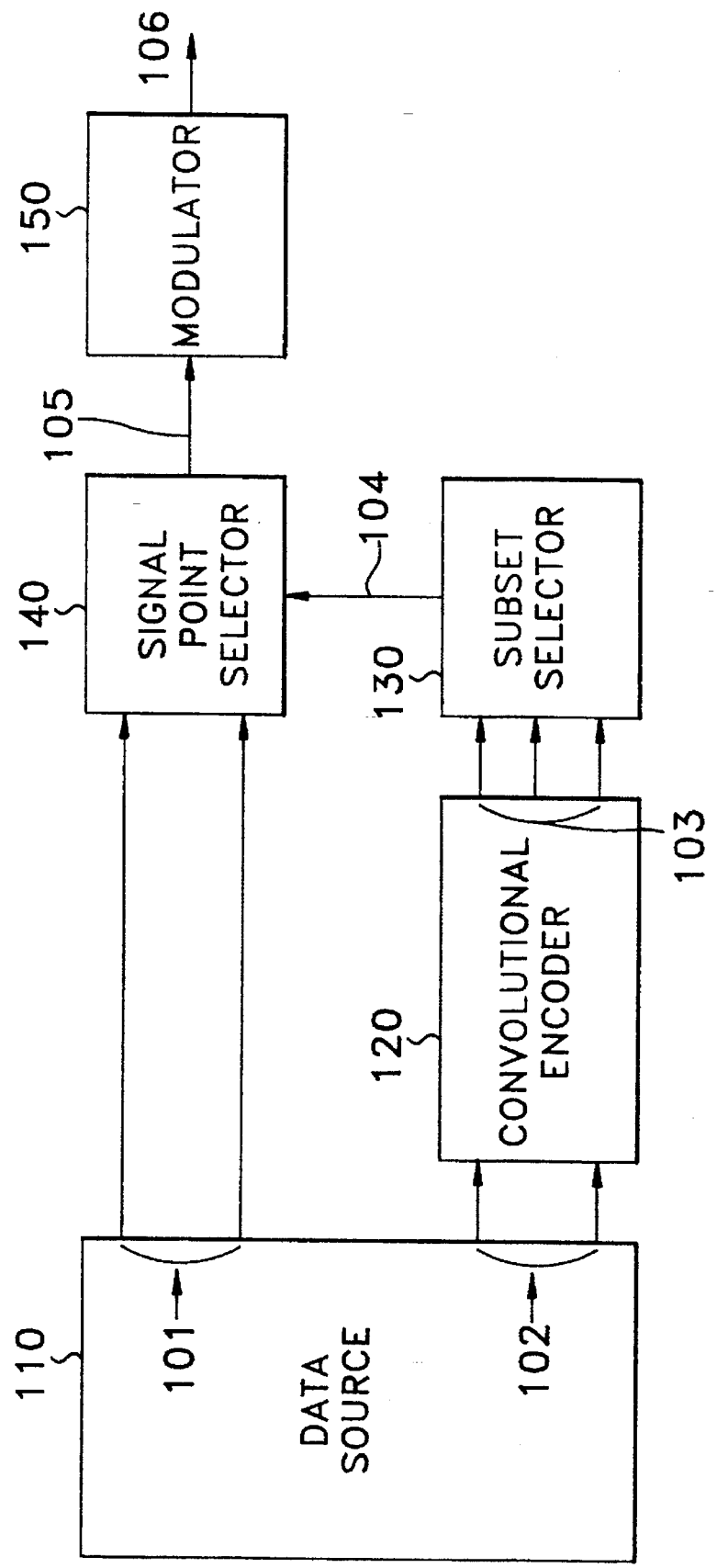
FIG. 1 is a block diagram of a conventional trellis-coded modulation system.
Figure 2:
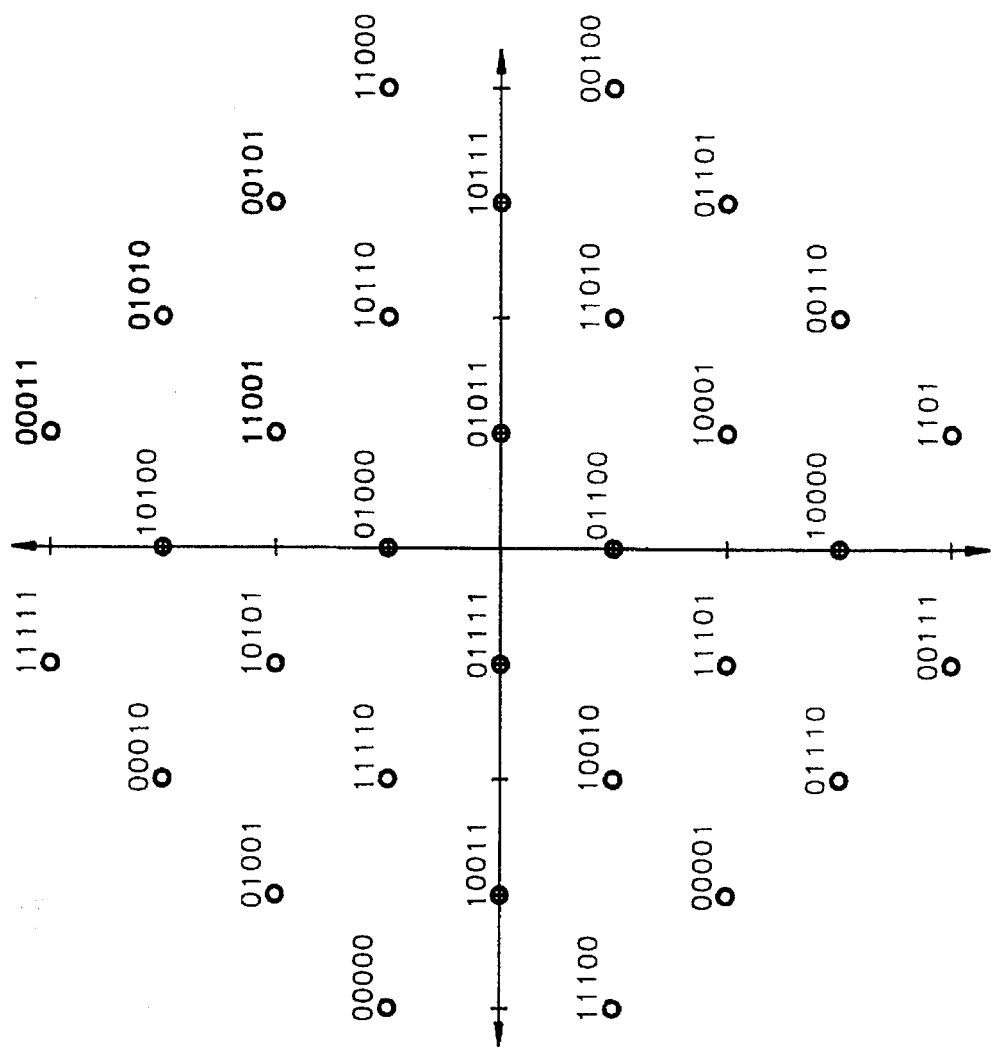
FIG. 2 is a signal constellation of the conventional trellis-coded modulation system shown in FIG. 1.

In FIG. 3, the eight-state and 2:3 coding rate convolutional encoder 210 outputs 3-bit symbol 205 by adding a redundant bit to 2-bit data 202 among the data transmitted from the data source 110 as shown in FIG. 1. Here, the convolutional encoder 210 is designed in two forms by adopting a new generation polynomial. Pre-mapper 220 receives uncoded 2-bit signal 201 and 3-bit output signal 205 of the convolutional encoder 210 and outputs digital values of two components for the signal points corresponding to the respective inputs, that is to say, the values of an in-phase component (I) 206 and a quadrature-phase component (Q) 207. Modulator 230 receives and modulates the output signals 206 and 207 from pre-mapper 220. Synchronization controlling circuit 240 controls the operation of the convolutional encoder 210 and pre-mapper 220 according to a synchronizing signal 203 of the adopted system. This is for performing the operations by distinguishing valid data and synchronizing data when a synchronizing signal is generated.

The present invention will now be described in detail.

The output signal points have different amplitudes and phases according to the respective bit symbols of the in-phase (I) and quadrature-phase (Q) axes. The pre-mapper 220 may be designed differently according to the signal constellation types. Three types are presented in the present invention and three types of pre-mapper are designed accordingly. Also, the eight-state 2:3 coding rate convolutional encoder 210 used in the present invention is a non-linear convolutional encoder adopting a new generation polynomial. Here, two types of convolutional encoders are proposed.

In order to eliminate unnecessary computation and reduce circuit configuration, the present invention uses a single logic combination circuit, i.e., the pre-mapper 220 of FIG. 3, instead of two select circuits 130 and 140, and directly outputs the values of signal points having the corresponding amplitude and phase.

Also, in designing the convolutional encoder 210, a conventional good code is not used but a new generation polynomial is produced. The performance for the new generation polynomial has been tested and adopted. The generation polynomial is designed for a nonlinear convolutional encoder whose coding rate is 2 to 3 and which is evaluated on the basis of the presence of characteristics such as minimum Hamming distance, error correction capability, the catastrophic error transmission, etc. Here, catastrophic error transmission characteristics makes an error affect the output of an encoder infinitely, and the codes without this characteristic are called good codes.

Figure 4:
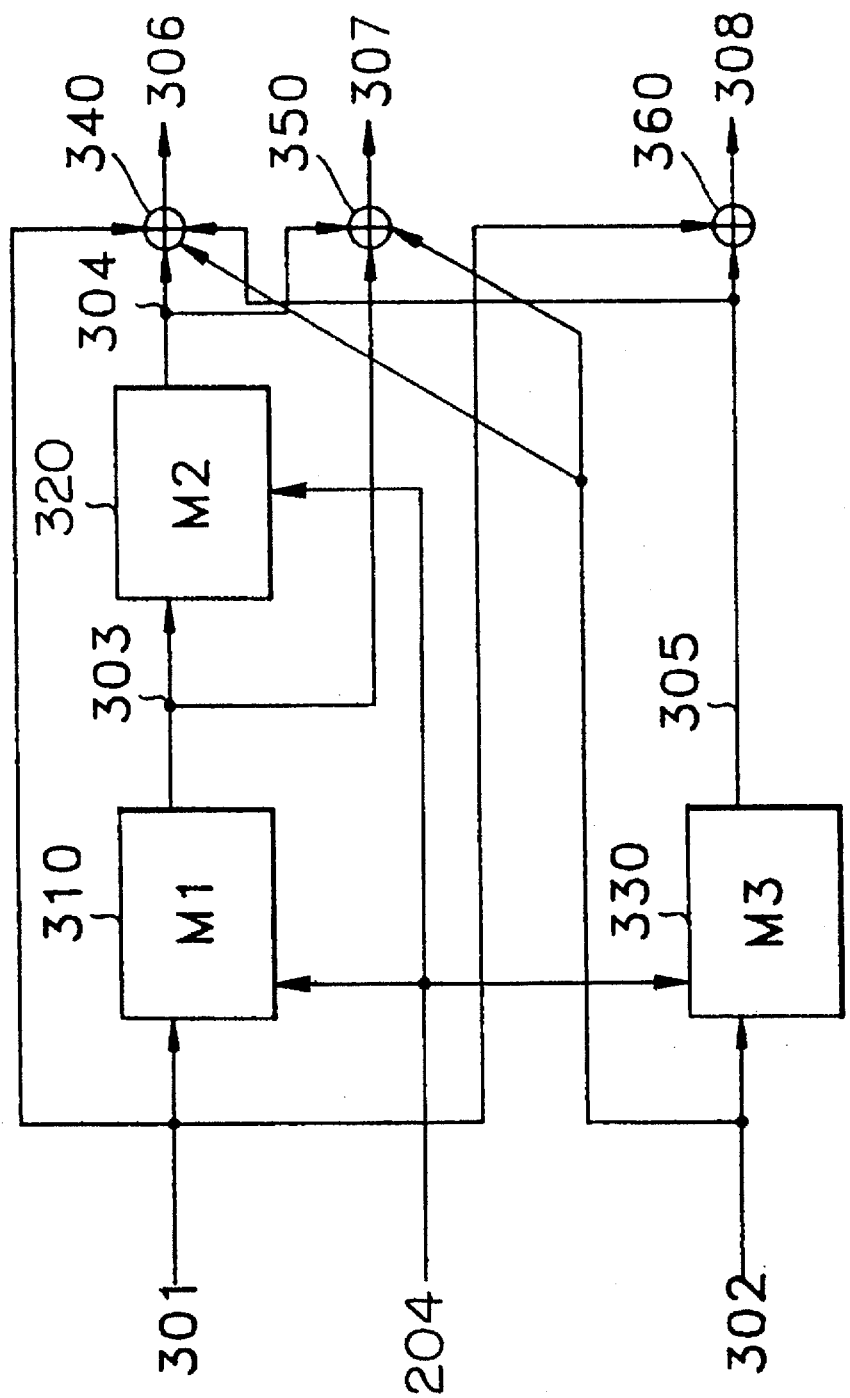
FIG. 4 is a block diagram of an embodiment of the convolutional encoder shown ill FIG. 3.
Figure 6:
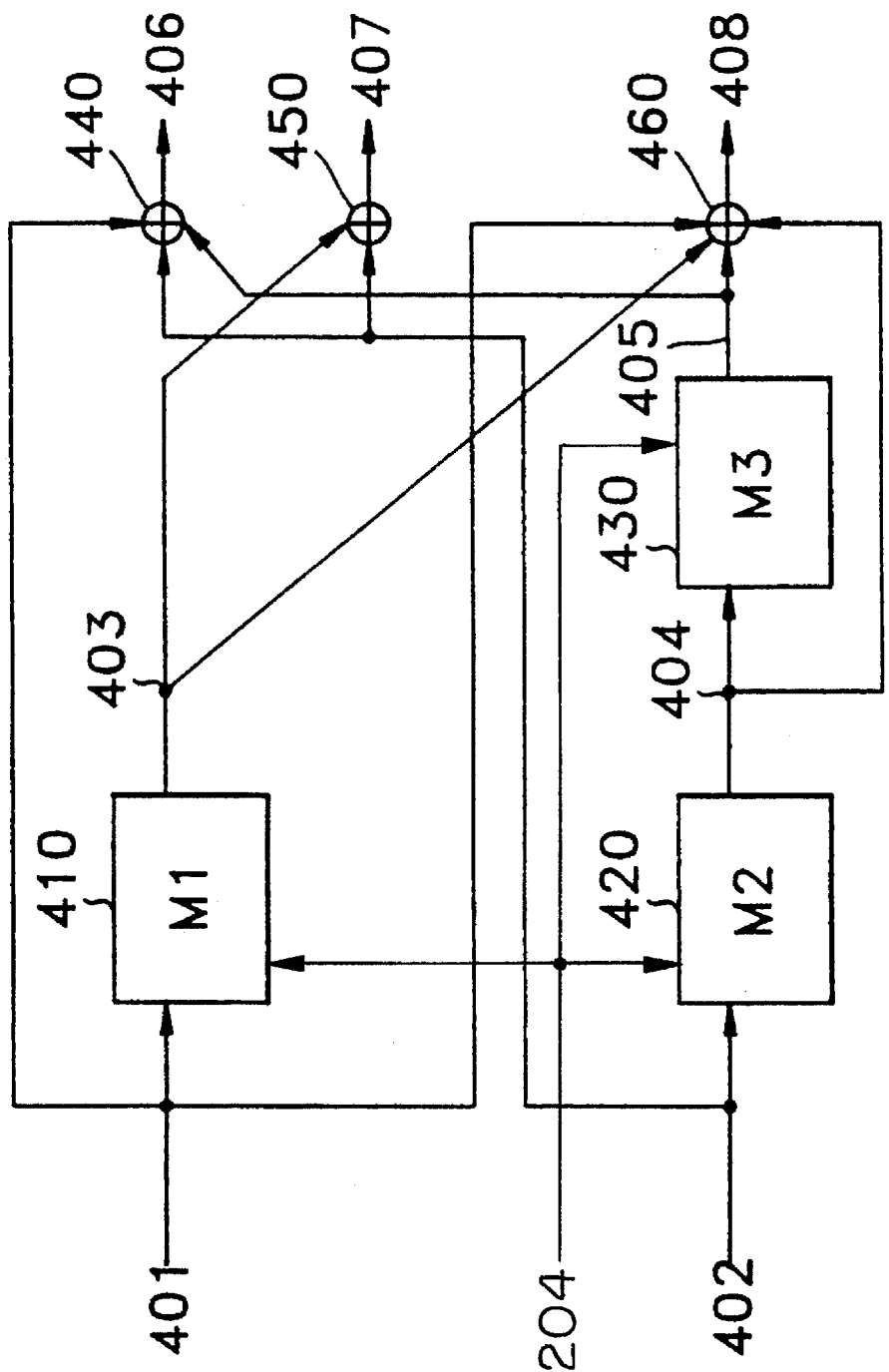
FIG. 6 is a block diagram of another embodiment of the convolutional encoder according to the present invention.

The present invention presents two types of convolutional encoders, as shown in FIGS. 4 and 6.

The generation polynomials for the encoder of FIG. 4 are as follows.

| | |
|---|---|
| $G(1)^1 = (101)_2$ | $G(2)^1 = (110)_2$ |
| $G(1)^2 = (011)_2$ | $G(2)^2 = (100)_2$ |
| $G(1)^3 = (100)_2$ | $G(2)^3 = (010)_2$ |

The generation polynomials for the encoder of FIG. 6 are as follows.

| | |
|---|---|
| $G(1)^1 = (100)_2$ | $G(2)^1 = (101)_2$ |
| $G(1)^2 = (010)_2$ | $G(2)^2 = (100)_2$ |
| $G(1)^3 = (110)_2$ | $G(2)^3 = (011)_2$ |

The state transition tables for these two encoders are shown in FIGS. 5 and 7, respectively. The respective convolutional encoders are constituted by three memory elements M1 to M3 and modulo-two sum connection type according to the generation polynomials. The pre-mapper is constructed on the basis of a 32-signal constellation and three constellation types are also selected. The three constellation types are described in FIGS. 9, 12 and 15, respectively. The set-partitions are performed by the Ungerboeck method in the 32-signal constellation and the mapping sequence of signal points is such that an error correction capability becomes high in view of the characteristics of the trellis map for the convolutional encoder. In other words, in consideration of the characteristic of a convolutional encoder, since the output values generated in transmitting from the current state to the next state to next state are largely divided into two groups of symbols, there is little probability of outputting the output values of the other group. Therefore, the minimum euclidean distance is irrelevant but the maximum intersymbol distance must be kept within each group. On such a basis, the sequence of signal points are designated and three type signal constellation structures and signal output tables in accordance therewith are described in FIGS. 9, 10, 12, 13, 15 and 16. The logic combination circuit of a pre-mapper is simplified using a Karnaugh map on the basis of a signal output table and is constituted by a small number of logic gates. The outputs of the pre-mapper are divided into in-phase components and quadrature-phase components of signal points, and digital symbols are then output.

Modulator 230 converts the digital symbols output from the pre-mapper to signal levels and transmits them on a carrier wave. Also, since the present invention relates to an encoder applicable to a magnetic recording and reproducing apparatus for a digital VCR using the TCM method, in view of the characteristics of the digital VCR system, it is necessary to separately process the input valid data symbols and synchronizing signals which are margin signals among the valid symbols. Therefore, a synchronization controller 240 is added, which determines the operation of the convolutional encoder and pre-mapper in accordance with the synchronizing signal.

FIG. 4 is a block diagram of an embodiment of the convolutional encoder shown in FIG. 3.

In FIG. 4, the convolutional encoder includes three memory elements 310, 320 and 330 (M1, M2 and M3) and modulo-two sum linked thereto in accordance with generation polynomials. For outputting 2-bit input data 301 and 302 as output data 306, 307 and 308, the convolutional encoder includes: a memory 310 for storing and outputting input data 301: a memory 330 for storing and outputting input data 302: a memory 320 for storing and outputting the output signal 303 of memory 310: a modulo-two adder 340 for adding together the output signal 304 of memory 320, the output signals of the input data 301 and 302 and the output signal of memory 330 and outputting output data 306; a modulo-two adder 350 for adding together the output signal 304 of memory 320, the output signal 303 of memory 310 and the input data 302 and outputting an output signal 307: and a modulo-two adder 360 for adding together the input data 301 and the output signal 305 of memory 330 and outputting an output signal 308. Among the output signals of the 3-bit output data, a first output bit 306 is a modulo-two sum added value of a present input bit 301 and a twice-delayed input bit of an upper stage, that is to say, a bit 304 prior to two system clock pulses and a remaining present input bit 302 and a once-delayed input bit 305 of a lower stage, that is to say, an input bit prior to a system clock. A second input bit 307 is also a modulo-two sum added value of a once-delayed input bit 303 and a twice-delayed input bit 304 of an upper stage and a present input bit 302 of a lower stage. A third output bit 308 is a modulo-two sum added value of a present input bit 301 of an upper stage and a once-delayed input bit 305 of a lower stage.

FIG. 5 is a state table according to the convolutional encoder shown in FIG. 4.

The signals have non-catastrophic error transmitting characteristics, and the Hamming distances of the signals are three or more.

FIG. 6 is a block diagram of another embodiment of the convolutional encoder shown in FIG. 3.

In FIG. 6, the convolutional encoder is composed of a linked structure by a modulo-two sum according to three memory elements 410, 420 and 430 (M1, M2 and M3) and generation polynomials. For outputting 2-bit input data 401 and 402 as output data 406. 407 and 408, the convolutional encoder includes: a memory 410 for storing and outputting an input data 401; a memory 420 for storing and outputting an input data 402; a memory 430 for storing and outputting the output signal 404 of memory 420; a modulo-two adder 440 for adding together the output signals of the input data 401 and 402 and the output signal 405 or memory 430 and outputting output data 406: a modulo-two adder 450 for adding together the output signal 403 of memory 410 and the input data 401 and outputting an output signal 407: and a modulo-two adder 460 for adding the together input data 402 and the output signals 403,404 and 405 of memories 410. 420 and 430 and outputting an output signal 408. Among the output signals of the 3-bit output signals data, a first output bit 406 is a modulo-two sum added value of a present input bit 401 of an upper stage and a present input bit 402 and a twice-delayed input bit 405 or a lower stage, that is to say, an input bit prior to two system clock pulses. A second bit 407 is also a modulo-two sum added value of a once-delayed input bit 403 of an upper stage and a present input bit 402 of a lower stage. A third bit 408 is a modulo-two sum added value of a present input bit 401 and a once-delayed input bit 403 of an upper stage and a once-delayed input bit 404 and a twice-delayed input bit 405 of a lower stage.

FIG. 7 is a state table according to the convolutional encoder shown in FIG. 6.

The signals have non-catastrophic error transmitting characteristics and a Hamming distance is three or more.

The respective convolutional encoders are composed of linked structures by a modulo-two sum according to three memory elements and generation polynomials.

Figure 8:
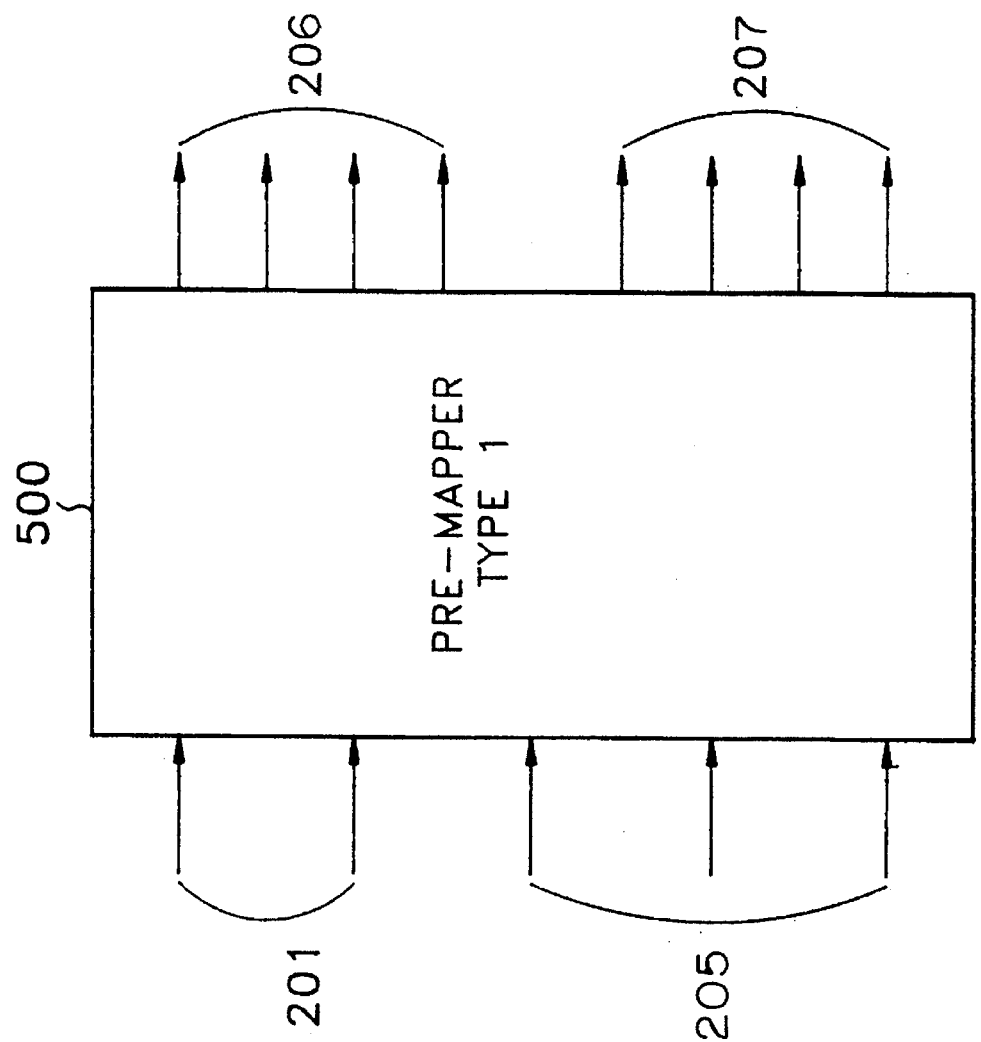
FIG. 8 is a block diagram of an embodiment of the pre-mapper shown in FIG. 3.

FIG. 8 is a block diagram of an embodiment of the pre-mapper shown in FIG. 3. In FIG. 8, uncoded 2-bit 201 anti a 3-bit output signal 205 of the convolutional encoder 210 are input and an 8-bit output signal is output.

Figure 9:
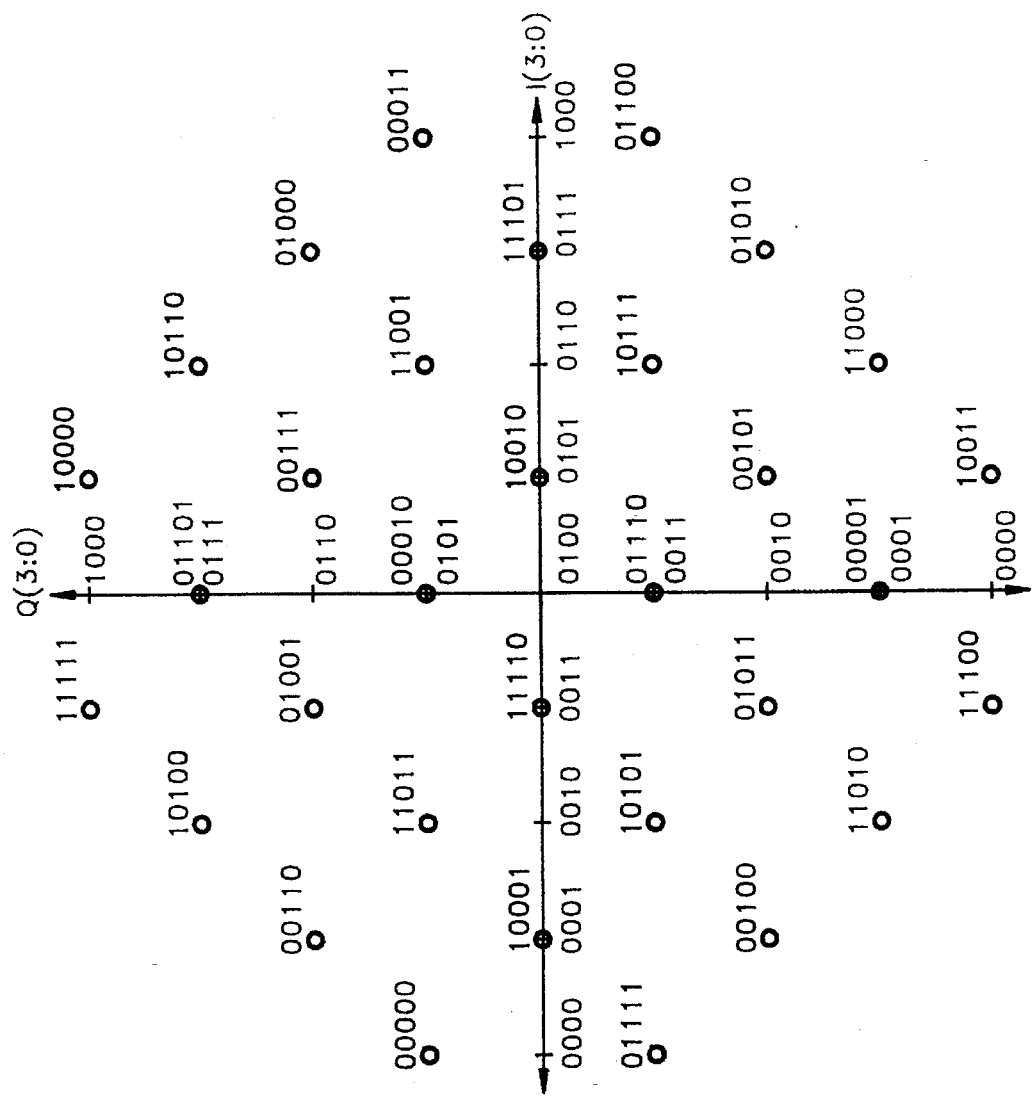
FIG. 9 is a signal constellation of the pre-mapper shown in FIG. 8.

FIG. 9 is a graph showing 1-phase and Q-phase components of FIG. 8. In FIG. 9, I-phase and Q-phase components of the signal input through a pre-mapper are shown.

FIG. 10 shows the output data of I-phase and Q-phase components for the input data of the pre-mapper shown in FIG. 8.

Figure 11:
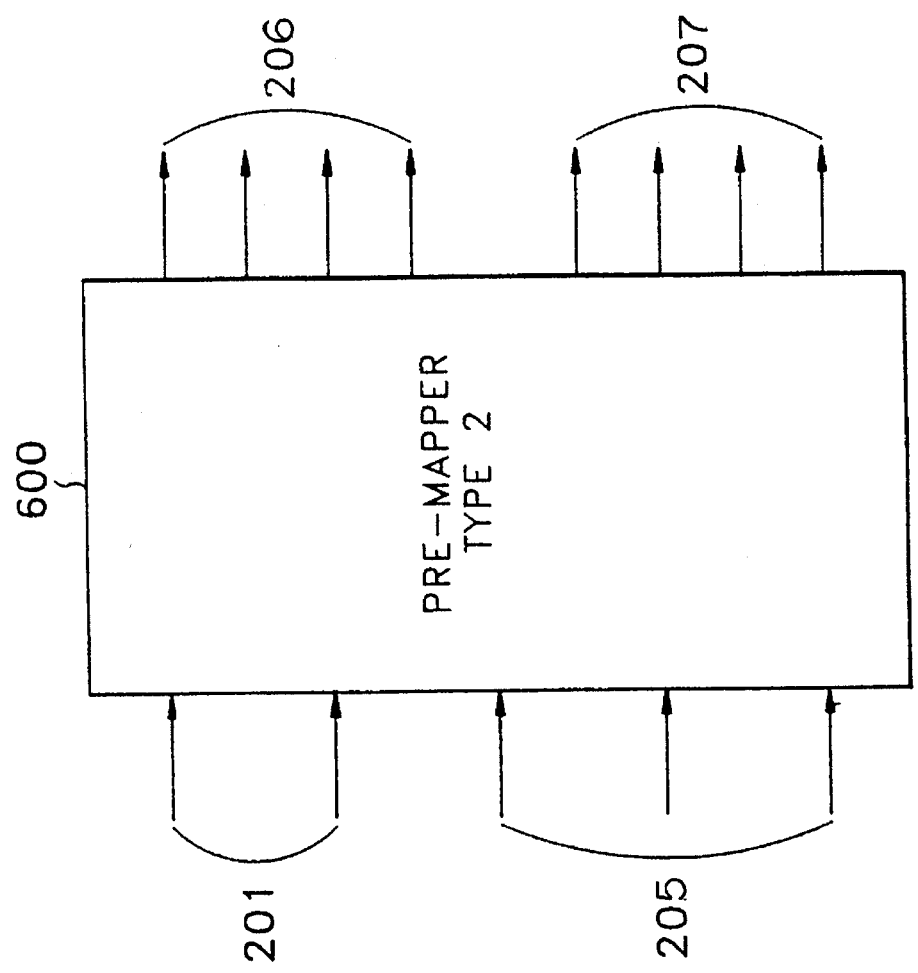
FIG. 11 is a block diagram of another embodiment of the pre-mapper shown in FIG. 3.

FIG. 11 shows another embodiment of the pre-mapper shown in FIG. 3. The pre-mapper shown in FIG. 11 inputs 2-bit uncoded data 201 and 3-bit output data 205 of the convolutional encoder and outputs 3-bit 1-phase and Q-phase component data.

Figure 12:
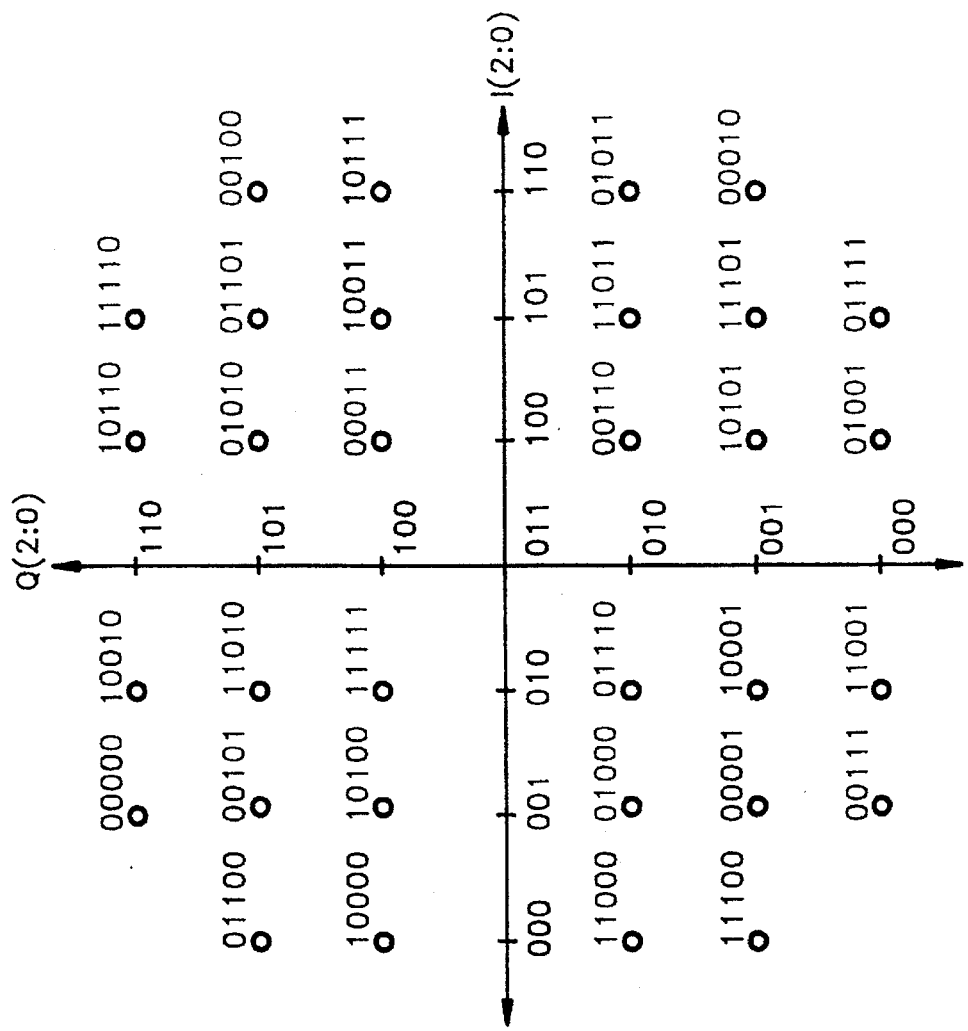
FIG. 12 is a signal constellation of the pre-mapper shown in FIG.

FIG. 12 is a graph showing I-phase and Q-phase component data of 6-bit output data for 5-bit input data.

FIG. 13 is a table showing the relationship between input data and output data of the pre-mapper shown in FIG. 11. That is to say, it shows the input data of 32 signals and the output data in accordance therewith.

Figure 14:
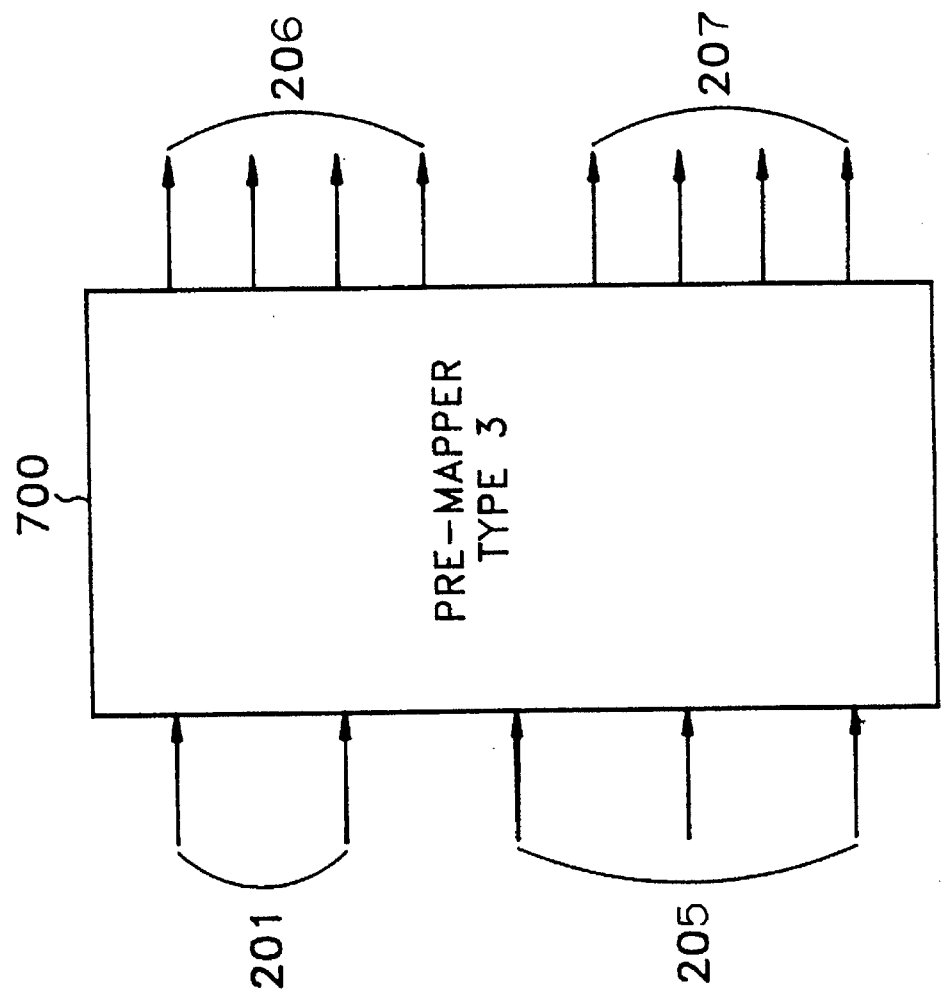
FIG. 14 is a block diagram of still another embodiment of tire pre-mapper shown in FIG. 3.

FIG. 14 shows another kind of the pre-mapper shown in FIG. 3. In FIG. 14, the number of bits of the input and output data of the pre-mapper are the same as that of the pre-mapper described in FIG. 8, but the output data for the input data are different.

Figure 15:
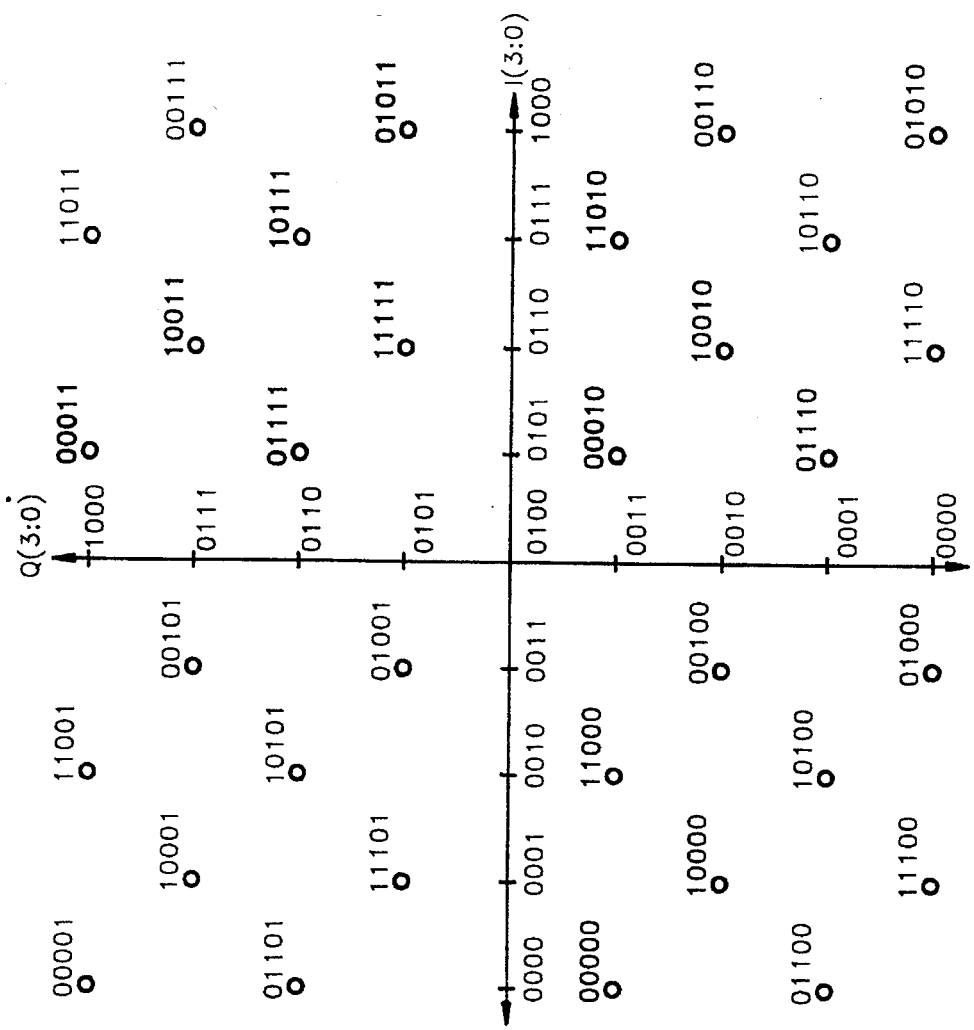
FIG. 15 is a signal constellation of tire pre-mapper shown in FIG. 14.

FIG. 15 is a graph showing I-phase and Q-phase component data for input data of the pre-mapper shown in FIG. 14.

FIG. 16 is a table showing the relationship between input data and output data of the pre-mapper shown in FIG. 14. That is to say, it shows output data in correlation to the input data.

Since the pre-mapper according to the present invention is a combination logic circuit designed on the basis of the signal point output table, each pre-mapper is designed separately for every signal constellation. Also, the outputs may be different according to the configuration types, even the three pre-mappers all have the same 32 signal constellations. In the present invention, the pre-mappers of FIGS. 8 and 14 output 4-bit symbols and the pre-mapper of FIG. 11 outputs 3-bit symbols.

Accordingly, 5-bit symbols input to the pre-mapper constituted by a combination logic circuit are output as the corresponding signal point values according to the output table of signal points. The in-phase and quadrature-phase outputs are input to a modulator and converted into the respective signal level values. The signal level values are modulated onto carrier waves and transmitted through a channel. At this time, a 5.7 MHz sine wave and cosine wave are used as the carrier waves. The level values of in-phase and quadrature-phase components are loaded onto the cosine wave and sine wave, respectively, are modulated and transmitted.

In the TCM system according to the present invention, an input signal is encoded to be mapped so that the euclidean distance between symbols is at maximum on a digital magnetic recording space when input data is converted to a signal point of a specific signal constellation. Therefore, the TCM system provides for higher coding gain than a prior art error correction system which uses the Hamming distance, without increasing bandwidth. Also, since the hardware of the TCM system can be reduced, circuit integration is easy. Further, since memory elements are not used in locating signal points, processing speed is also improved considerably.

What is claimed is:

1. A convolutional encoder for encoding upper and lower stages of input source data into output data, comprising:

first adding means for outputting a first output bit among a 3-bit output signal by a modulo-two sum of a present input bit and a twice-delayed input bit of an upper stage of input source data, a present input bit and a once-delayed input bit of a lower stage of input source data;

second adding means for outputting a second output bit among said 3-bit output signal by a modulo-two sum of a once-delayed input bit and a twice-delayed input bit of the upper stage and a present input bit of the lower stage; and third adding means for outputting a third output bit among said 3-bit output signal by a modulo-two sum of a present input bit of the upper stage and a once-delayed input bit of the lower stage.

2. A convolutional encoder for encoding upper and lower stages of input source data into output data, comprising:

first adding means for outputting a first output bit among a 3-bit output signal by a modulo-two sum of a present input bit of an upper stage of input source data and a twice-delayed input bit of a lower stage of input source data and a remaining present input bit of said lower stage;

second adding means for outputting a second output bit among said 3-bit output signal by a modulo-two sum of a once-delayed input bit of the upper stage and a present input bit of the lower stage; and third adding means for outputting a third output bit among said 3-bit output signal by a modulo-two sum of a present input bit and a once-delayed input bit of the upper stage, a once-delayed input bit of the lower stage and a twice-delayed input bit of the lower stage.

3. A trellis coded modulation system comprising:

coding means for inputting selected bits of input source data, coding the input source data, and outputting encoded source data, said coding means having first adding means for outputting a first output bit among 3-bit output bits of said encoded source data by a modulo-2 sum of a present input bit and a twice-delayed input bit of an upper stage of said selected bits of input source data, and remaining present input bit and a once-delayed input bit of a lower stage of said selected bits of input source data, second adding means for outputting a second output bit among said 3-bit output bits by a modulo-2 sum of a once-delayed input bit and a twice-delayed input bit of the upper stage and the present input bit of the lower stage, and third adding means for outputting a third output bit among said 3-bit output bits by a modulo-2 sum of a present input bit of the upper stage and the once-delayed input bit of the lower stage;

mapping means for inputting remaining uncoded bits of said input source data and the encoded source data from said coding means and converting them into a predetermined bit signal pattern;

modulating means for modulating the bit signal pattern output from said mapping means; and controlling means for controlling said coding means and said mapping means according to a synchronizing signal.

4. A trellis-coded modulation system as claimed in claim 3, characterized in that said mapping means satisfies the following input/output table for inputting 2-bit uncoded data and 3-bit coded data and outputting 8-bit data:

| input data | output data |
|---|---|
| 00000 | 0000 0101 |
| 00001 | 0100 0001 |
| 00010 | 0100 0101 |
| 00011 | 1000 0101 |
| 00100 | 0001 0010 |
| 00101 | 0101 0010 |
| 00110 | 0001 0110 |
| 00111 | 0101 0110 |
| 01000 | 0111 0110 |
| 01001 | 0011 0110 |
| 01010 | 0111 0010 |
| 01011 | 0011 0010 |
| 01100 | 1000 0011 |
| 01101 | 0100 0111 |
| 01110 | 0100 0011 |
| 01111 | 0000 0011 |
| 10000 | 0101 1000 |
| 10001 | 0001 0100 |
| 10010 | 0101 0100 |
| 10011 | 0101 0000 |
| 10100 | 0010 0111 |
| 10101 | 0010 0011 |
| 10110 | 0110 0111 |
| 10111 | 0110 0011 |
| 11000 | 0110 0001 |
| 11001 | 0110 0101 |
| 11010 | 0010 0001 |
| 11011 | 0010 0101 |
| 11100 | 0011 0000 |
| 11101 | 0111 0100 |
| 11110 | 0011 0100 |
| 11111 | 0011 1000 |

5. A Trellis-coded modulation system as claimed in claim 3, characterized in that said mapping means satisfies the following input/output table for inputting 2-bit uncoded data and 3-bit coded data and outputting 8-bit data:

| input data | output data |
|---|---|
| 00000 | 0000 0011 |
| 00001 | 0000 1000 |
| 00010 | 0101 0011 |
| 00011 | 0101 1000 |
| 00100 | 0011 0010 |
| 00101 | 0011 0111 |
| 00110 | 1000 0010 |
| 00111 | 1000 0111 |
| 01000 | 0011 0000 |
| 01001 | 0011 0101 |
| 01010 | 1000 0000 |
| 01011 | 1000 0101 |
| 01100 | 0000 0001 |
| 01101 | 0000 0110 |
| 01110 | 0101 0001 |
| 01111 | 0101 0110 |
| 10000 | 0001 0010 |
| 10001 | 0001 0111 |
| 10010 | 0110 0010 |
| 10011 | 0110 0111 |
| 10100 | 0010 0001 |
| 10101 | 0010 0111 |
| 10110 | 0111 0001 |
| 10111 | 0111 0110 |
| 11000 | 0010 0011 |
| 11001 | 0010 1000 |
| 11010 | 0111 0011 |
| 11011 | 0111 1000 |
| 11100 | 0001 0000 |
| 11101 | 0001 0101 |
| 11110 | 0110 0000 |
| 11111 | 0110 0101 |

6. A trellis-coded modulation system as claimed in claim 3, characterized in that said mapping means comprises means satisfying the following input/output table for inputting 2-bit uncoded data and 3-bit coded data and outputting 6-bit data:

| input data | output data |
|---|---|
| 00000 | 001 110 |
| 00001 | 001 001 |
| 00010 | 110 001 |
| 00011 | 100 100 |
| 00100 | 110 101 |
| 00101 | 001 101 |
| 00110 | 100 010 |
| 00111 | 001 000 |
| 01000 | 001 010 |
| 01001 | 100 000 |
| 01010 | 100 101 |
| 01011 | 110 010 |
| 01100 | 000 101 |
| 01101 | 101 101 |
| 01110 | 010 010 |
| 01111 | 101 000 |
| 10000 | 000 100 |
| 10001 | 010 001 |
| 10010 | 010 110 |
| 10011 | 101 100 |
| 10100 | 001 100 |
| 10101 | 100 001 |
| 10110 | 100 110 |
| 10111 | 110 100 |
| 11000 | 000 010 |
| 11001 | 010 000 |
| 11010 | 010 101 |
| 11011 | 101 010 |
| 11100 | 000 001 |
| 11101 | 101 001 |
| 11110 | 101 110 |
| 11111 | 010 100 |

7. A trellis coded modulation system comprising:

coding means for inputting selected bits of input source data, coding the input source data, and outputting encoded source data, said coding means having first adding means for outputting a first output bit among 3-bit output bits of said encoded source data by a modulo-2 sum of a present input bit of an upper stage of said selected bits of input source data and a twice-delayed input bit of a lower stage of said selected bits of input source data and a remaining present input bit of said lower stage, second adding means for outputting a second output bit among said 3-bit output bits by a modulo-2 sum of a once-delayed input bit of the upper stage and a present input bit of the lower stage and third adding means for outputting a third output bit among said 3-bit output bits by a modulo-2 sum of a present input bit and a once-delayed input bit of the upper stage, a once-delayed input bit of the lower stage, and a twice delayed input bit of the lower stage;

mapping means for inputting remaining uncoded bits of said input source data and the encoded source data from said coding means and converting them into a predetermined bit signal pattern;

modulating means for modulating the bit signal pattern output from said mapping means; and controlling means for controlling said coding means and said mapping means according to a synchronizing signal.

* * * * *

UNITED STATES PATENT AND TRADEMARK OFFICE
CERTIFICATE OF CORRECTION

PATENT NO. : 5,537,430
DATED : July 16, 1996
INVENTOR(S) : Hyun-woo Park et al.

It is certified that error appears in the above-indentified patent and that said Letters Patent is hereby corrected as shown below:

Col. 1, line 29, "2-bit 101 signal" should be -- 2-bit signal 101 --; Col. 1, line 32, "to" should be -- for --; Col. 2, line 17, "range" should be -- stage --; Col. 2, line 34, ":" should be -- ; --; Col. 2, line 36, ":" should be -- ; --; Col. 2, line 38, ":" should be -- ; --; Col. 2, line 40, "ill" should be -- in --; same line, ":" should be -- ; --; Col. 2, line 45, ":" should be -- ; --; Col. 2, line 49, ":" should be -- ; --; Col. 2, line 51, ":" should be -- ; --; Col. 2, line 56, ":" should be -- ; --; Col. 2, line 58, after "FIG." insert -- 11; --; Col. 2, line 60, ":" should be -- ; --; Col. 2, line 62, ":" should be -- ; --; Col. 2, line 64, "tire" should be -- the --; Col. 4, line 36, delete "type";
Col. 8, line 31 (claim 5), "Trellis-coded" should be -- trellis-coded --.

Signed and Sealed this

Nineteenth Day of November, 1996

Attest:

BRUCE LEHMAN

*Attesting Officer*     *Commissioner of Patents and Trademarks*